(12) United States Patent
Lotfi et al.

(10) Patent No.: US 7,462,317 B2
(45) Date of Patent: *Dec. 9, 2008

(54) METHOD OF MANUFACTURING AN ENCAPSULATED PACKAGE FOR A MAGNETIC DEVICE

(75) Inventors: Ashraf W. Lotfi, Bridgewater, NJ (US); Mathew Wilkowski, Nazareth, PA (US); John D. Weld, Ledgewood, NJ (US)

(73) Assignee: Enpirion, Inc., Bloomsbury, NJ (US)

( * ) Notice: Subject to any disclaimer, the term of this patent is extended or adjusted under 35 U.S.C. 154(b) by 743 days.

This patent is subject to a terminal disclaimer.

(21) Appl. No.: 10/985,825

(22) Filed: Nov. 10, 2004

(65) Prior Publication Data

US 2006/0096088 A1 May 11, 2006

(51) Int. Cl.
*B29C 45/14* (2006.01)
*H01F 27/02* (2006.01)

(52) U.S. Cl. .................. 264/272.16; 264/272.13; 264/272.19; 336/90

(58) Field of Classification Search ............ 264/272.16, 264/272.19, 272.13
See application file for complete search history.

(56) References Cited

U.S. PATENT DOCUMENTS

| | | | |
|---|---|---|---|
| 1,889,398 A | 11/1932 | Bishop | |
| 2,600,473 A | 6/1952 | Brockman | |
| 3,691,497 A | 9/1972 | Bailey et al. | |
| 3,908,264 A | 9/1975 | Friberg et al. | |
| 4,199,743 A * | 4/1980 | Martincic | 336/96 |
| 4,433,927 A * | 2/1984 | Cavallari | 400/124.11 |
| 4,586,436 A | 5/1986 | Denney et al. | |
| 4,681,718 A | 7/1987 | Oldham | |
| 4,847,986 A | 7/1989 | Meinel | |
| 4,870,224 A | 9/1989 | Smith et al. | |
| 4,916,522 A | 4/1990 | Cohn | |
| 4,975,671 A | 12/1990 | Dirks | |
| 5,056,214 A | 10/1991 | Holt | |
| 5,285,369 A | 2/1994 | Balakrishnan | |
| 5,345,670 A | 9/1994 | Pitzele et al. | |
| 5,353,001 A | 10/1994 | Meinel et al. | |
| 5,469,334 A | 11/1995 | Balakrishnan | |

(Continued)

FOREIGN PATENT DOCUMENTS

| | | | |
|---|---|---|---|
| GB | 2 041 818 | * | 9/1980 |
| JP | 402228013 A | | 9/1990 |
| JP | 5-314885 | | 11/1993 |
| JP | 6-251958 | * | 9/1994 |

OTHER PUBLICATIONS

Betancourt-Zamora, R.J. et al., "A 1.5 mW, 200 MHz CMOS VCO for Wireless Biotelemetry," First International Workshop on Design of Mixed-Mode Integrated Circuits and Applications, Cancun, Mexico, pp. 72-74, Jul. 1997.

(Continued)

*Primary Examiner*—Melvin C Mayes
(74) *Attorney, Agent, or Firm*—Slater & Matsil, L.L.P.

(57) ABSTRACT

A method of manufacturing an encapsulated package for a magnetic device on a substrate. In one embodiment, the method includes providing a magnetic core on the substrate and placing a shielding structure over the magnetic core to create a chamber thereabout. The method also includes depositing an encapsulant about a portion of the magnetic core within the chamber. The shielding structure limits the encapsulant entering the chamber.

20 Claims, 4 Drawing Sheets

U.S. PATENT DOCUMENTS

| | | | |
|---|---|---|---|
| 5,524,334 A * | 6/1996 | Boesel | 29/605 |
| 5,574,420 A | 11/1996 | Roy et al. | |
| 5,578,261 A | 11/1996 | Manzione et al. | |
| 5,692,296 A | 12/1997 | Variot | |
| 5,787,569 A | 8/1998 | Lotfi et al. | |
| 5,802,702 A | 9/1998 | Fleming et al. | |
| 6,005,377 A | 12/1999 | Chen et al. | |
| 6,094,123 A | 7/2000 | Roy | |
| 6,118,351 A | 9/2000 | Kossives et al. | |
| 6,255,714 B1 | 7/2001 | Kossives et al. | |
| 6,440,750 B1 | 8/2002 | Feygenson et al. | |
| 6,479,981 B2 | 11/2002 | Schweitzer, Jr. et al. | |
| 6,495,019 B1 | 12/2002 | Filas et al. | |
| 6,541,819 B2 | 4/2003 | Lotfi et al. | |
| 6,549,409 B1 | 4/2003 | Saxelby, Jr. et al. | |
| 6,578,253 B1 | 6/2003 | Herbert | |
| 6,624,498 B2 | 9/2003 | Filas et al. | |
| 6,649,422 B2 | 11/2003 | Kossives et al. | |
| 6,731,002 B2 | 5/2004 | Choi | |
| 6,747,538 B2 | 6/2004 | Kuwata et al. | |
| 6,912,781 B2 | 7/2005 | Morrison et al. | |
| 6,989,121 B2 | 1/2006 | Thummel | |
| 6,998,952 B2 | 2/2006 | Zhou et al. | |
| 7,015,544 B2 | 3/2006 | Lotfi et al. | |
| 7,019,505 B2 | 3/2006 | Dwarakanath et al. | |
| 7,020,295 B2 | 3/2006 | Hamada et al. | |
| 7,038,438 B2 | 5/2006 | Dwarakanath et al. | |
| 7,057,486 B2 * | 6/2006 | Kiko | 336/178 |
| 7,101,737 B2 | 9/2006 | Cobbley | |
| 7,180,395 B2 * | 2/2007 | Lotfi et al. | 336/90 |
| 7,214,985 B2 | 5/2007 | Lotfi et al. | |
| 7,230,302 B2 | 6/2007 | Lotfi et al. | |
| 7,236,086 B1 | 6/2007 | Vinciarelli et al. | |
| 7,250,842 B1 | 7/2007 | Johnson et al. | |
| 7,256,674 B2 * | 8/2007 | Lotfi et al. | 336/90 |
| 7,276,998 B2 * | 10/2007 | Lotfi et al. | 336/90 |
| 7,330,017 B2 | 2/2008 | Dwarakanath et al. | |
| 2001/0030595 A1 | 10/2001 | Hamatani et al. | |
| 2003/0076662 A1 | 4/2003 | Miehling | |
| 2005/0167756 A1 | 8/2005 | Lotfi et al. | |
| 2005/0168203 A1 | 8/2005 | Dwarakanath et al. | |
| 2005/0168205 A1 | 8/2005 | Dwarakanath et al. | |
| 2005/0169024 A1 | 8/2005 | Dwarakanath et al. | |
| 2006/0038225 A1 | 2/2006 | Lotfi et al. | |
| 2006/0096087 A1 * | 5/2006 | Lotfi et al. | 29/841 |
| 2006/0145800 A1 | 7/2006 | Dadafshar et al. | |

OTHER PUBLICATIONS

Goodman, J. et al., "An Energy/Security Scalable Encryption Processor Using an Embedded Variable Voltage DC/DC Converter," IEEE Journal of Solid-State Circuits, vol. 33, No. 11 (Nov. 1998).

Horowitz, P., et al., "The Art of Electronics," Second Edition, 1989, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, vol. 89, No. 6, pp. 833-845.

Sato, et al., "Influences of Molding Conditions on Die-Pad Behavior in IC Encapsulation Process Analyzed by Hall Element Method," IEEE Transactions on Advanced Packaging, Aug. 2000, pp. 574-581, vol. 23, No. 3, IEEE, Los Alamitos, CA.

* cited by examiner

METHOD OF MANUFACTURING AN ENCAPSULATED PACKAGE FOR A MAGNETIC DEVICE

TECHNICAL FIELD

The present invention is directed, in general, to electronics packaging and, more specifically, to a method of manufacturing an encapsulated package for a magnetic device.

BACKGROUND

A magnetic device uses magnetic material arranged to shape and direct magnetic flux in a predetermined manner to achieve a desired electrical performance. The magnetic flux provides a medium for storing, transferring or releasing electromagnetic energy. The magnetic devices typically include a core having a predetermined volume and composed of a magnetic material (e.g., ferrite) having a magnetic permeability greater than that of a surrounding medium (e.g., air). A conductive winding (or a plurality of conductive windings) of a desired number of turns and carrying an electrical current surround, excite and are excited by the magnetic core (or legs thereof). Inasmuch as the magnetic core usually has a relatively high permeability, magnetic flux produced by the conductive windings is generally confined almost entirely to the magnetic core. The magnetic flux follows the path that the magnetic core defines; magnetic flux density is essentially consistent over a uniform cross sectional area of the magnetic core, particularly for magnetic cores having a small cross sectional area.

The magnetic devices are often used to suppress electromagnetic interference. When used in the suppression role, the efficiency with which a magnetic device stores and releases electrical power is not usually a concern. However, magnetic devices are also frequently employed to transmit, convert or condition electrical power (so called "power magnetic devices"). Under such conditions (often in an environment of a power converter to power a microprocessor or the like), a performance and efficiency of the magnetic device becomes a major concern. protective, heat dissipating package for electronic circuitry such as an integrated circuit embodying the power converter to power the microprocessor. Often, the electronic circuitry can be encapsulated or "molded," wherein an encapsulant is formed about the electronic circuitry to yield a unitary, board mountable package. One well known configuration for a board mountable package is a so called dual in-line package, wherein electrical leads protrude from opposing sidewalls of the package. The leads are advantageously so arranged to allow the package to be mounted to a circuit board by various conventional soldering processes. The dual in-line packages are widely used for packaging integrated circuits, most often in computer-related environments.

It has been long felt that power converters would greatly benefit from such encapsulation. However, in the pursuit of producing encapsulated, power converter packages (also referred to as "power modules"), it was discovered that the normally effective operation of encapsulating the power conversion circuitry with a conventional thermosetting epoxy molding compound through a conventional transfer molding process can degrade the magnetic performance and efficiency of the magnetic devices. As a result, an overall efficiency of the power converter suffered well below an acceptable level.

More specifically, an underlying effect that occurs when magnetic devices are encapsulated (causing the magnetic performance of the devices to degrade) is magnetostriction. Magnetostriction (and a related effect of strain pinning of the domain walls of the magnetic cores) occurs as a result of molding pressures and post-molding stresses on the magnetic cores within the power conversion circuitry. Magnetostriction in the magnetic material causes degradation of magnetic properties when placed under tensile or compressive stress. The magnetostriction and strain pinning causes the permeability of the magnetic core to decrease and coercivity thereof to increase. As a result, the electrical design of the power conversion circuitry suffers from both reduced inductance values and reduced quality factors (e.g., higher magnetic core losses).

In the past, work around solutions emerged to address this impasse. First, most designs for power converters simply avoided the problem by remaining unencapsulated. Unfortunately, the power converters were unable to take advantage of the physical protection and additional heat dissipating capacity that encapsulation provides. The unencapsulated power converters were also difficult to mount on a circuit board due to a lack of suitable soldering processes and handling surfaces. The power conversion circuitry of the unencapsulated power converters were also subject to detrimental exposure to washing processes during the manufacture thereof and to potentially damaging conditions in inhospitable environments.

Another solution revolved around employing compliant material disposed about at least a portion of the magnetic core of the magnetic device as disclosed in U.S. Pat. No. 5,787, 569, entitled "Encapsulated Package for Power Magnetic Devices and Method of Manufacture Therefor," to Lotfi, et al. ("Lotfi"), issued on Aug. 4, 1998, which is incorporated herein by reference. Lotfi discloses a package for a power magnetic device with a magnetic core subject to magnetostriction when placed under stress. The package includes a compliant material disposed about the magnetic core and an encapsulant surrounding the compliant material and the magnetic core. The compliant material provides a medium for absorbing stress between the encapsulant and the magnetic core. The compliant material reduces the magnetostriction upon the magnetic core caused by the stress from the encapsulant. The package also includes a vent that allows for a displacement of the compliant material thereby providing further stress relief for the power magnetic device. While Lotfi provides a viable alternative to dealing with the stress upon a magnetic core from the encapsulant, it may be cumbersome to deposit the compliant material about the magnetic core in some applications.

Yet another solution was disclosed in U.S. Pat. No. 5,578, 261 entitled "Method of Encapsulating Large Substrate Devices Using Reservoir Cavities for Balanced Mold Filling," to Manzione, et al. ("Manzione"), issued Nov. 26, 1996, which is incorporated herein by reference. Manzione uses reservoir cavities to balance the flow in a mold cavity between the flow fronts above and below a large area substrate. The reservoir cavities are external to the molded plastic package for an electronic device substrate to direct a flow of the molding compound away therefrom. While Manzione provides an alternative to direct excess molding compound away from the electronic device substrate, it may not viable to employ such a solution in some applications.

Accordingly, what is first needed in the art is an understanding of the underlying effect that occurs when magnetic devices are encapsulated, causing the magnetic performance of the magnetic devices to degrade. Further, what is needed (once the effect is understood) is an encapsulated package for magnetic devices and a power module, and an associated highly economical and feasible method of manufacture for such encapsulated packages that does not substantially hinder the magnetic performance thereof.

SUMMARY OF THE INVENTION

These and other problems are generally solved or circumvented, and technical advantages are generally achieved, by advantageous embodiments of the present invention which includes a method of manufacturing an encapsulated package for a magnetic device located on a substrate. In one embodiment, the method includes providing a magnetic core on the substrate and placing a shielding structure over the magnetic core to create a chamber thereabout. The method also includes depositing an encapsulant about a portion of the magnetic core within the chamber. The shielding structure limits the encapsulant entering the chamber.

In another aspect, the present invention provides another method of manufacturing an encapsulated package for a magnetic device on a substrate. In one embodiment, the method includes providing a magnetic core on the substrate and placing a shielding structure including a baffle over the magnetic core to create a chamber thereabout. The method also includes depositing an encapsulant about a portion of the magnetic core within the chamber. The shielding structure limits the encapsulant entering the chamber and the baffle directs the encapsulant away from the magnetic core.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, an encapsulatable package for a magnetic device, a power module and a method of manufacture thereof. While the principles of the present invention will be described in the environment of a power converter, any application that may benefit from an encapsulatable package for a magnetic device is well within the broad scope of the present invention.

As will become more apparent, the encapsulatable package for the magnetic device includes a magnetic core and at least one conductive winding. The magnetic core has magnetic properties that can be compromised by mechanical stress produced by an encapsulant in contact with a sufficient surface area of the magnetic core. The magnetic core is protected from wide area contact with the encapsulant by a shielding structure that creates a chamber about at least a portion of the magnetic core. The shielding structure may be open at one end thereof for positioning over the magnetic core. The shielding structure makes an incomplete, imperfect or partial seal about the magnetic core against intrusion of the encapsulant during an application thereof. During encapsulation, while a limited amount or a portion of the encapsulant penetrates the seal, the encapsulant does not make contact with a sufficient surface area of the magnetic core to substantially compromise the magnetic performance thereof.

Figure 1:
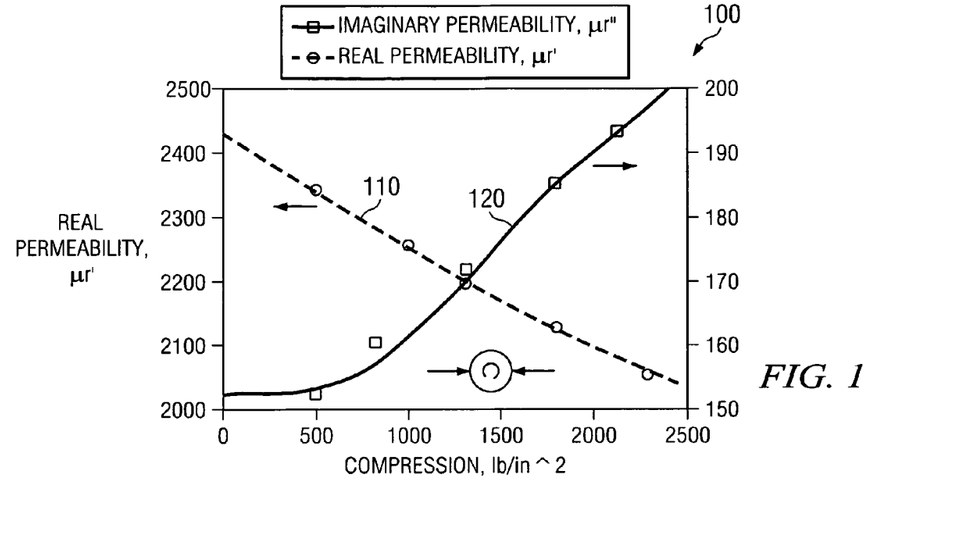
FIG. 1 illustrates a graphical representation of a complex permeability of a magnetic device under compressive stress.

Referring initially to FIG. 1, illustrated is a graphical representation 100 of a complex permeability of a magnetic device under compressive stress. In high frequency switch mode power modules, manganese zinc ferrites are often used as the magnetic core material in magnetic devices such as energy storage inductors and transformers. In these and other applications, the magnetic cores cannot be directly encapsulated with a rigid material since the resulting stress causes a loss of permeability, and resulting magnetic core losses in both manganese zinc and nickel zinc ferrites. Again, the compressive stress on the magnetic material causes a phenomenon called magnetostriction, thereby causing an overall degradation of the magnetic properties of the magnetic device. For instance, the saturation magnetostriction coefficient $\lambda_s$ for most manganese zinc ferrites is about $1\times10^{-6}$ to $5\times10^{-6}$ and for most nickel zinc ferrites (due to the presence of the nickel) is about $15\times10^{-6}$ to $20\times10^{-6}$. The addition of small amounts of cobalt can reduce the saturation magnetostriction coefficient $\lambda_s$.

As an example, to measure the level of magnetostriction in the manganese zinc ferrite, a toroidal shaped magnetic core is subject to external lateral and normal compressive forces. While toroidal ferrite cores are used in the illustrated embodiment for material measurements and characterization because of the symmetry, flux uniformity and consistent cross sectional areas associated therewith, magnetostrictive effects are equally applicable to other types of magnetic materials and magnetic core configurations. The complex permeability provides a criterion for characterizing a magnetic material because it is directly related to an electrical impedance of a conductive winding associated with the magnetic core.

The complex permeability can be derived from a real permeability (represented by line 110) and an imaginary permeability (represented by line 120), of an impedance associated with the magnetic core. The real permeability 110 corresponds to an inductance resulting from the magnetization available in the magnetic core. The imaginary permeability 120 measures the dissipation within the magnetic core material. The toroidal ferrite core is subject to variable pressure to fully characterize the stress dependence thereof. The variable pressure on the toroidal ferrite core results in changes in the complex permeability under dynamic conditions (e.g., 500 kilohertz). A drop in real permeability 110 is accompanied by an increase in the imaginary permeability 120, signaling a loss of inductance and an increase in magnetic core dissipation. Even under the smallest stress (e.g., less than 500 pounds per square inch or 34.5 bar), where the magnetic core loss does not increase, permeability drops by five percent.

However, the difference in the coefficient of thermal expansion (and contraction) induced stress over a wide range of operating temperatures is far greater (e.g., greater than 2000 pounds per square inch or 138 bar) leading to a drop of real permeability 110 in the range of 16 percent, a rise in imaginary permeability 120 in the range of 32 percent and a substantial decrease in the overall permeability for the magnetic device. While the illustrated embodiment exhibits the stress dependence of complex permeability for a toroidal ferrite core, the same or analogous principles apply to any magnetic device under compressive stresses. Simply stated, the magnetostrictive effects on magnetic materials under stress induce unacceptable reductions of the magnetic properties in the magnetic device.

Figure 2:
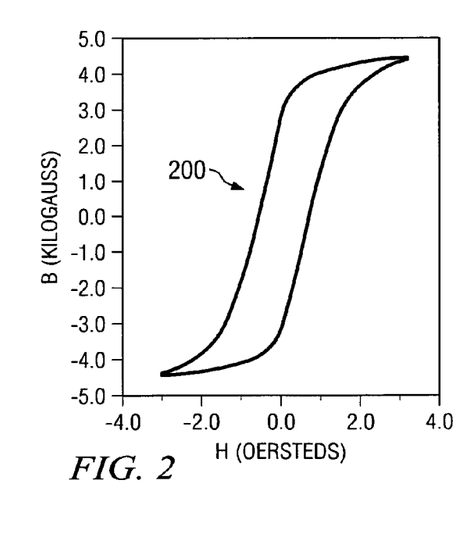
FIG. 2 illustrates a dynamic hysteresis loop of the magnetic device of FIG. 1 under substantially stress free conditions.

Turning now to FIG. 2, illustrated is a dynamic hysteresis loop 200 of the magnetic device of FIG. 1 under substantially stress free conditions. The hysteresis loop 200 demonstrates a steady state relation between a magnetic induction in the magnetic material of the magnetic device and the steady state alternating magnetic intensity that produces it. For each value of magnetizing force (in oersteds) applied to the magnetic device, two values of magnetic flux density (in gauss) are illustrated in the hysteresis loop 200. The illustrated embodiment demonstrates a 500 kilohertz hysteresis loop 200 with a three oersteds drive into saturation. Under stress free conditions, the amplitude permeability is 1424 and the coercivity is 0.64 oersteds. The domains of the magnetic field, therefore, have been aligned resulting in a flux density with an upper limit of about 4430 gauss.

Figure 3:
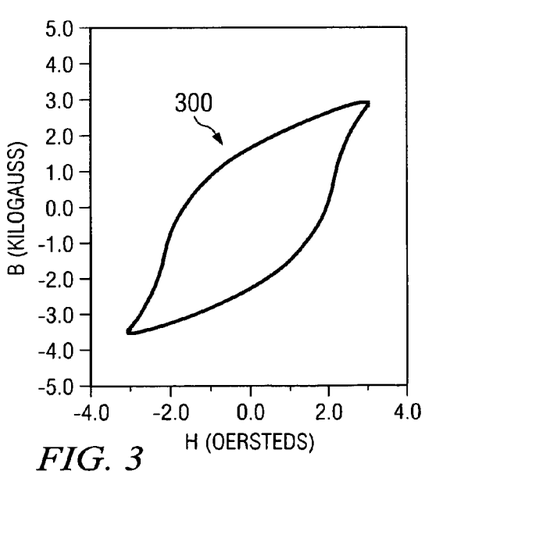
FIG. 3 illustrates a dynamic hysteresis loop of the magnetic device of FIG. 1 molded in an encapsulant such as a thermosetting epoxy molding compound and placed under compressive stress.

Turning now to FIG. 3, illustrated is a dynamic hysteresis loop 300 of the magnetic device of FIG. 1 molded in an encapsulant such as a thermosetting epoxy molding compound and placed under compressive stress. The magnetic device is illustrated as being molded in a thermosetting epoxy molding compound at 170 degrees Celsius and subsequently cooled to room temperature. The thermally induced stress is established and, as displayed in the illustrated embodiment, the hysteresis loop 300 is substantially deformed. Under these conditions, the amplitude permeability (from the average slope) is about 1100 and the coercivity has increased three fold to about 1.85 oersteds, indicating large strain energy that induces significant domain wall pinning. Under the same driving field of three oersteds, alignment of domains is very difficult since the flux density is only about 3380 gauss. The excessive stress, therefore, limits alignment of the domains to 76 percent and increases the magnetic core dissipation to virtually 45 percent higher than the original unstressed state.

Figure 4:
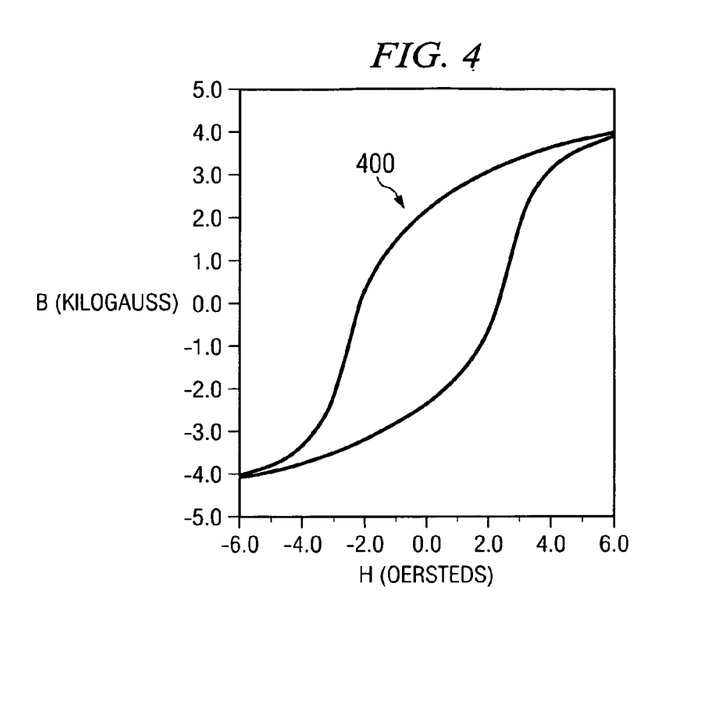
FIG. 4 illustrates a dynamic hysteresis loop of the magnetic device of FIG. 1 compensating for the losses associated with the conditions demonstrated with respect to FIG. 3.

Turning now to FIG. 4, illustrated is a dynamic hysteresis loop 400 of the magnetic device of FIG. 1 compensating for the losses associated with the conditions demonstrated with respect to FIG. 3. In the illustrated embodiment, the field drive of the magnetic device is doubled to align the remaining pinned domains left unaligned from the conditions described above. Alignment is limited to 92 percent, resulting in an increased magnetic core dissipation of about 108 percent. This outcome demonstrates the magnitude of external energy needed to overcome the strain energy barrier. Clearly, it is not practical to design a magnetic device to compensate for these unacceptable losses, and the energy necessary to overcome these losses is intolerable.

Therefore, before it becomes practical to encapsulate power modules in encapsulants such as a thermosetting epoxy molding compounds or the like, it is necessary to determine methods of protecting the magnetic cores such as a ferrite core of magnetic devices. In connection therewith, several criteria should be addressed. First, the magnetic properties of the magnetic device should be preserved through the post molded stress relief period as the magnetic device cools from the molding temperature to room temperature. Second, the thermal characteristics of the magnetic device to operate efficiently over a specified range should be maintained. Finally, manufacturing costs should be maintained at a competitive level.

Figure 5:
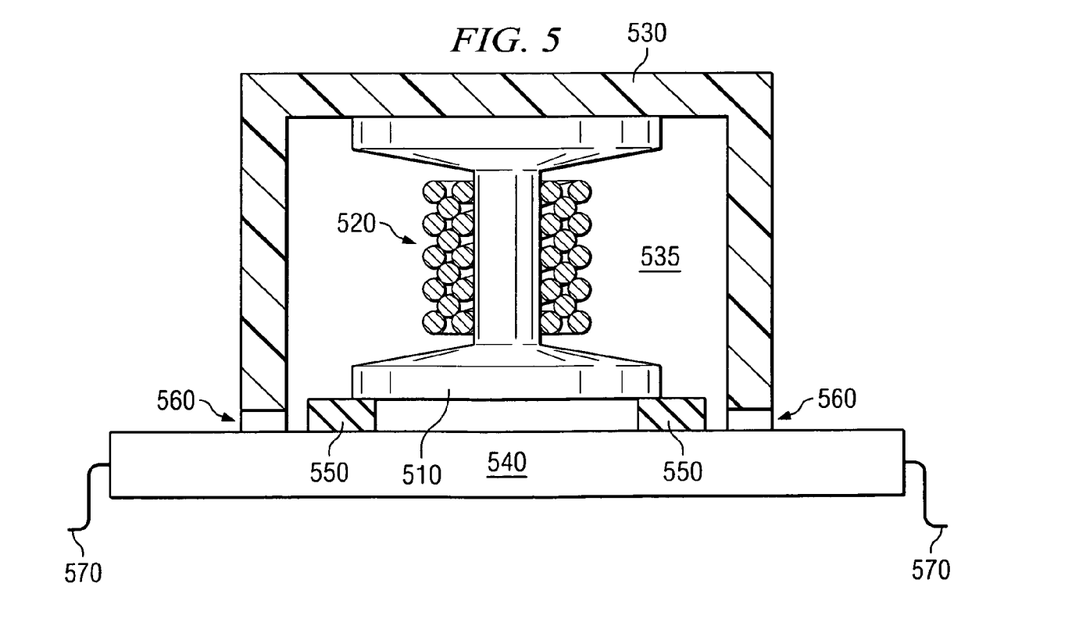
FIG. 5 illustrates a cross sectional view of an embodiment of an encapsulatable package for a magnetic device constructed according to the principles of the present invention.

Turning now to FIG. 5, illustrated is a cross sectional view of an embodiment of a partially completed encapsulatable package for a magnetic device (also referred to as a "packagable magnetic device") constructed according to the principles of the present invention. The packagable magnetic device may be employed in a power module or module employing a magnetic device to advantage. The packagable magnetic device includes a magnetic core (e.g., a ferrite core) 510 with surrounding electrically conductive windings 520 (i.e., at least one conductive winding) thereabout. The magnetic core 510 is located (e.g., mounted) on a substrate 540 such as a printed wiring board, and may be separated from the substrate by stand offs 550.

To protect the magnetic core 510 from an encapsulant such as an overlying molding compound like an epoxy molding compound applicable during a manufacturing process and with a potentially different coefficient of thermal expansion from the magnetic material thereof, a shielding structure such as a protective cap 530 is placed about the magnetic core 510 and conductive windings 520 that creates an incomplete, imperfect or partial seal via an opening 560 with the underlying substrate 540. The protective cap 530 creates a chamber 535 about the magnetic core 510 and conductive windings 520 and may be substantially free of any material therein. The protective cap 530 may be formed from a material such as a ceramic material, aluminum, copper, molded plastic material, or other suitable sufficiently rigid material.

While the shielding structure is embodied in a protective cap 530 in the illustrated embodiment, any structure capable of protecting the magnetic core 510 from the encapsulant while creating an incomplete, imperfect or partial seal thereabout is well within the broad scope of the present invention. The packagable magnetic device further includes electrical leads 570 protruding from, for instance, opposing sidewalls of the substrate 540 to allow the packagable magnetic device to be mounted to another substrate or circuit board. The electrical leads 570 are thus available for conventional soldering processes. The electrical leads 570 may be configured for a through hole arrangement (as illustrated in FIG. 5) or may be configured as surface mount pads or as any other attachment arrangement.

Molded plastic packages for conventional integrated circuits are obviously not a new notion, but applying molded plastic packages to magnetic devices or power modules, in general, for the aforementioned reasons offers unique challenges due to stress induced performance degradations due to overmolding, potting, or similar packaging processing. Although the encapsulating processes described herein reference heat cured epoxy compounds, other thermal setting compounds or other molding, casting, or potting compounds that exhibit a coefficient of thermal expansion mismatch or other stress inducing effect on a magnetic core 510, such as may result from a curing operation or from aging, are included herein without limitation such as ultraviolet, infrared, oven cured, or room temperature cured materials, including multi-part materials, rubber-based, silicone-based, or further potting materials of other compositions.

During application of the overlying molding compound, a limited amount of compound penetrates through the opening 560 and contacts only a small portion of the magnetic core 510. Thus, the protective cap 530 limits the amount of the molding compound that enters the chamber 535 to limit the amount of molding compound that surrounds the magnetic core 510. Stated another way, the chamber 535 is partially filled with the molding compound and the molding compound contacts (or is about) a portion of the magnetic core 510. The limited penetration provides protection for the magnetic core 510. The conductive windings 520 and any further obstructions to the molding compound contacting the magnetic core 510 such as insulating tape around the conductive windings 520 or a rigid or compliant barrier provide further protection for the magnetic core 510. Thus, the packagable magnetic device provides a magnetic core 510 with reduced exposure to the overlying molding compound, avoiding a substantial portion of the stress induced performance degradation as herein described.

More specifically, the effects of magnetostriction (and a related effect of strain pinning of the domain walls of the magnetic cores) are reduced as a result of molding pressures and post-molding stresses on the magnetic core 510. Again, magnetostriction in a magnetic core 510 causes degradation of magnetic properties when placed under tensile or compressive stress. The magnetostriction and strain pinning causes the permeability of the magnetic core 510 to decrease and coercivity thereof to increase. By decreasing the amount of encapsulant about the magnetic core 510, not only are the molding pressures reduced but the post-molding stresses resulting from, for instance, when the molding compound cures are significantly reduced. In accordance therewith, the opening 560 allows the molding compound (or at least a portion thereof) to exit the chamber 535, if necessary, as the molding compound cures.

Figure 6:
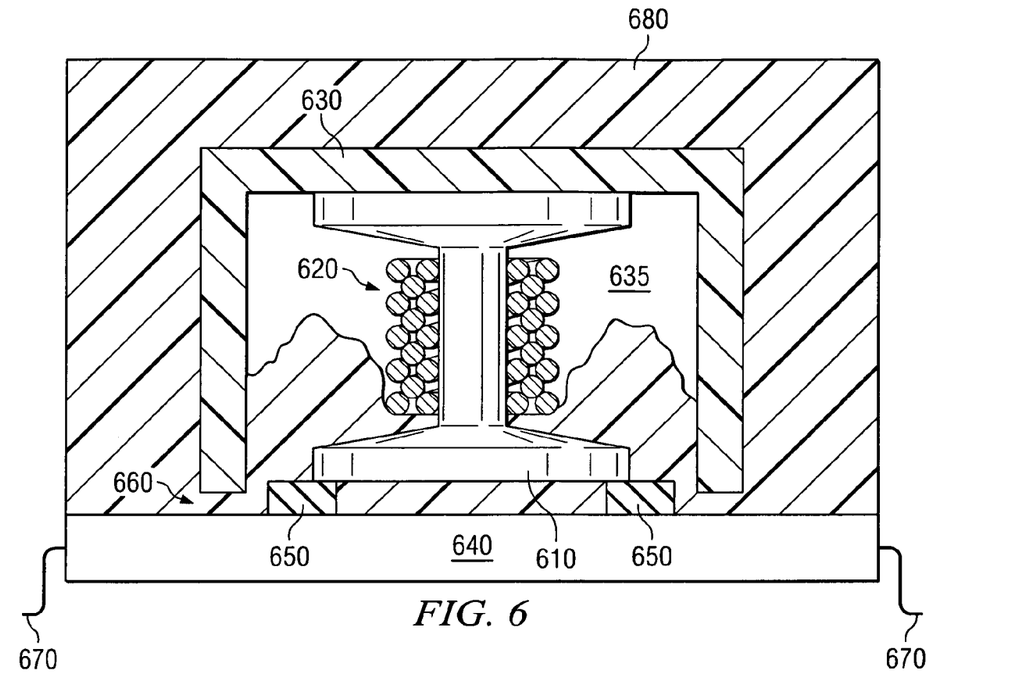
FIG. 6 illustrates a cross sectional view of an embodiment of an encapsulated package for a magnetic device constructed according to the principles of the present invention.

Turning now to FIG. 6, illustrated is a cross sectional view of an embodiment of an encapsulated package for a magnetic device (also referred to as a "packaged magnetic device") following application of an encapsulant such as a molding compound constructed according to the principles of the present invention. The packaged magnetic device includes a magnetic core (e.g., a ferrite core) 610 with surrounding electrically conductive windings 620 (i.e., at least one conductive winding) thereabout. The magnetic core 610 is mounted on a substrate 640 and may be separated from the substrate by stand offs 650.

To protect the magnetic core 610 from an overlying molding compound 680 such as an epoxy molding compound applicable during a manufacturing process and with a potentially different coefficient of thermal expansion from the magnetic material thereof, a shielding structure such as protective cap 630 is placed about the magnetic core 610 and conductive windings 620 that create an incomplete, imperfect or partial seal via an opening 660 with the underlying substrate 640. The protective cap 630 creates a chamber 635 about the magnetic core 610 and conductive windings 620. The packaged magnetic device further includes electrical leads 670 protruding from, for instance, opposing sidewalls of the substrate 640 to allow the packaged magnetic device to be mounted to another substrate or circuit board.

The molding compound 680 is applied about the protective cap 630 and forms a portion of an external surface of the packaged magnetic device. The molding compound 680 provides protection from environmental elements including later manufacturing steps such as washing as well as providing an improved heat conducting medium for internal components of the packaged magnetic device. The molding compound 680 penetrates the opening 660 at a junction between the protective cap 630 and the substrate 640. The protective cap 630 limits the amount of the molding compound 680 that enters the chamber 635 to limit the amount of molding compound 680 that contacts (or surrounds) the magnetic core 610. Thus, a portion of the molding compound 680 contacts (or is about) the magnetic core 610, thereby providing only limited mechanical stress thereupon.

An embodiment of manufacturing (constructing or forming) the packaged magnetic device will hereinafter be described. First, a substrate with a plurality of electrical leads is provided as a foundation for the packaged magnetic device. For an example of a substrate having a plurality of leads protruding therefrom, see U.S. Pat. No. 5,345,670 entitled "Method of Making a Surface-Mount Power Magnetic Device," to Pitzele, et al., issued Sep. 13, 1994, which is incorporated herein by reference. A plurality of stand offs are then located on the substrate followed by placing a magnetic core with at least one conductive winding thereabout on the plurality of stand offs. The conductive winding(s) may be wound about the magnetic core or placed about the magnetic core employing planar magnetics such as disclosed in Pitzele, et al. Then, a protective cap is placed over the magnetic core to create a chamber thereabout and a partial seal thereabout (and with the substrate). The substrate with the magnetic core and protective cap are placed in a mold cavity. An encapsulant is then incorporated (e.g., deposited) by, for instance, flowing an epoxy molding compound that has been heated within a range of about 165 to 190 degrees Celsius, or other suitable encapsulant over and about the protective cap, thereby providing substantially complete encapsulation. As mentioned above, a portion of the molding compound penetrates the partial seal via an opening at the junction of the protective cap and the substrate. A portion of the molding compound contacts the magnetic core, thereby providing only limited mechanical stress thereupon. Thus, only a portion of the magnetic core is in contact with (or surrounded by) the molding compound.

The magnetic core experiences an increase in stress as the molding compound cools to room temperature thereby shrinking around the magnetic core (i.e., when the molding compound cures). The shrinkage that occurs during the cooling of the molding compound around the magnetic core creates the principal stress thereto. The stress induces magnetostrictive effects that may degrade a performance of the magnetic core. Although a velocity pressure head of the molding compound flow front and a static packing pressure may vary from 40 to 50 pounds per square inch and 350 to 500 pounds per square inch, respectively, during the molding process of the packaged magnetic device as described herein, the velocity pressure head does not create a large enough stress on the magnetic core to induce substantial magnetostrictive effects. A major portion of the stress on the magnetic core occurs during a cooling period after molding. The stress is produced by the differences in the coefficient of thermal expansion (or other aging- or curing-related effects) between the epoxy or other molding compound and in the magnetic material of the magnetic core. The amount of stress on the magnetic core may be approximately 13,000 pounds per square inch on some portions of the magnetic core and three times that value in corners of the magnetic core. The large increase in stress in corners of the magnetic core is generated at sharp radii of the corners. Also, the opening in the protective cap allows the molding compound (or at least a portion thereof) to exit the chamber, if necessary, as the molding compound cures.

Figure 7:
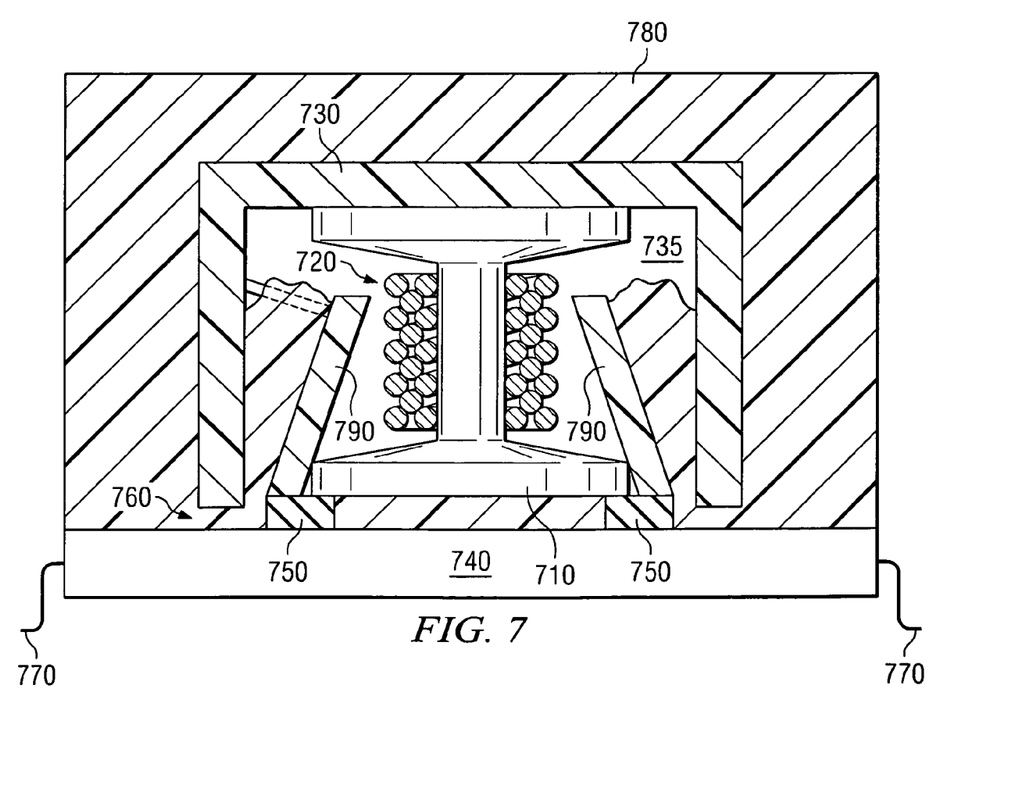
FIG. 7 illustrates a cross sectional view of another embodiment of an encapsulated package for a magnetic device constructed according to the principles of the present invention.

Turning now to FIG. 7, illustrated is a cross sectional view of another embodiment of an encapsulated package for a magnetic device (also referred to as a "packaged magnetic device") following application of an encapsulant such as a molding compound constructed according to the principles of the present invention. The packaged magnetic device includes a magnetic core (e.g., a ferrite core) 710 with surrounding electrically conductive windings 720 (i.e., at least one conductive winding) thereabout. The magnetic core 710 is mounted on a substrate 740 and may be separated from the substrate by stand offs 750.

To protect the magnetic core 710 from an overlying molding compound 780 such as an epoxy molding compound applicable during a manufacturing process and with a potentially different coefficient of thermal expansion from the magnetic material thereof, a shielding structure such as a protective cap 730 including a baffle 790 (e.g., plate(s), wall(s) or screen(s)) is placed about the magnetic core 710 and conductive windings 720 that creates an incomplete, imperfect or partial seal via an opening 760 with the underlying substrate 740. The protective cap 730 creates a chamber 735 about the magnetic core 710 and conductive windings 720. The packaged magnetic device further includes electrical leads 770 protruding from, for instance, opposing sidewalls of the substrate 740 to allow the packaged magnetic device to be mounted to another substrate or circuit board.

The baffle 790 (which is coupled to a sidewall of the protective cap 730) directs the flow of the molding compound 780 to a region within the chamber 735 away from the magnetic core 710, at least to a region where the induced stress on the magnetic core 710 will have a reduced effect on the magnetic properties thereof. The baffle 790 may be formed integrally with the protective cap 730, of the same or different materials, or may be left unattached, or may be coupled to the substrate 740 or elsewhere. The intent is to create a region separated from the magnetic core 710 to contain the molding compound 780 that penetrates the opening 760 that is formed between the protective cap 730 and the substrate 740 or other portion of the packaged magnetic device.

Figure 8:
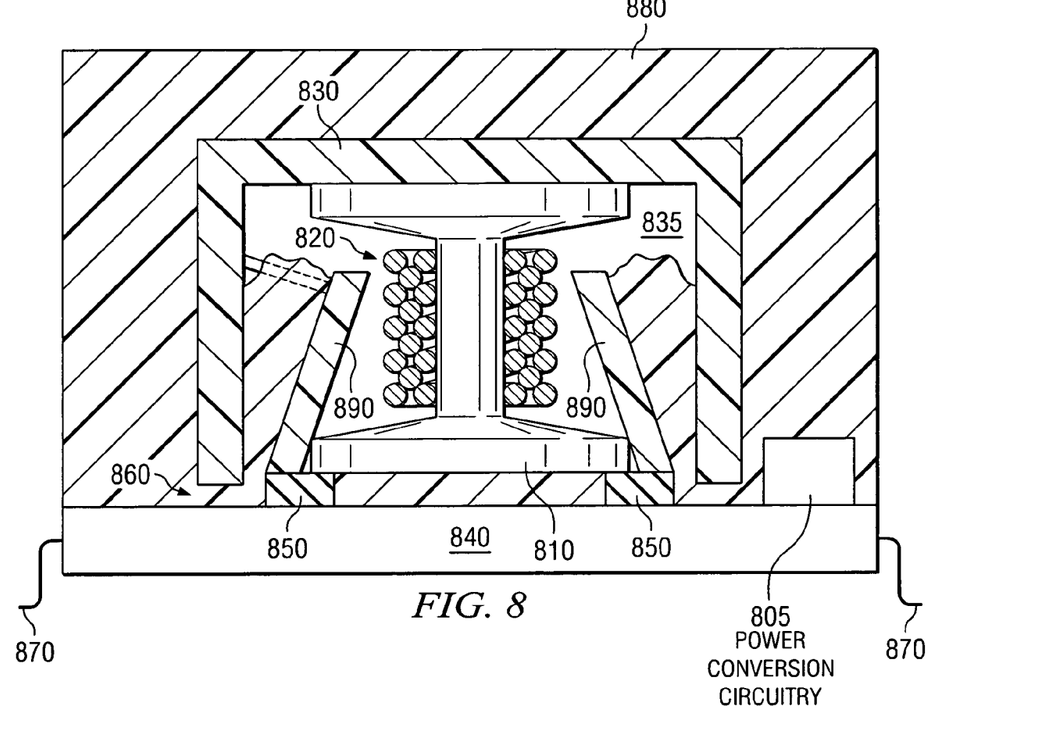
FIG. 8 illustrates a cross sectional view of an embodiment of a power module constructed according to the principles of the present invention.

Turning now to FIG. 8, illustrated is a cross sectional view of an embodiment of a power module following application of an encapsulant constructed according to the principles of the present invention. The power module includes power conversion circuitry including a magnetic device and other power conversion circuitry 805 such as a power train (with at least one switch), a driver and a controller. An example of the power conversion circuitry is illustrated and described with respect to FIG. 9.

The magnetic device is embodied in a packaged magnetic device including a magnetic core 810 with surrounding electrically conductive windings 820 thereabout. The magnetic core 810 is mounted on a substrate 840 and may be separated from the substrate by stand offs 850. To protect the magnetic device and other power conversion circuitry 805 from environmental conditions and the like, an encapsulant 880 is deposited thereabout. To protect the magnetic device from the encapsulant 880, however, a shielding structure 830 including a baffle 890 is placed about the magnetic core 810 and conductive windings 820 that creates an incomplete, imperfect or partial seal via an opening 860 with the underlying substrate 840. The shielding structure 830 creates a chamber 835 about the magnetic core 810 and conductive windings 820. The baffle 890 directs the flow of the encapsulant 880 to a region within the chamber 835 away from the magnetic core 810. The power module further includes electrical leads 870 protruding from, for instance, opposing sidewalls of the substrate 840 to allow the power module to be mounted to another substrate or circuit board.

When manufacturing the power module, in addition to the steps described above, the other power conversion circuitry such as the power train is located (e.g., mounted) on the substrate in addition to the magnetic device (which may be pre-packaged). An encapsulant is then applied over the power conversion circuitry to form a protective, heat dissipating package for the power module.

Figure 9:
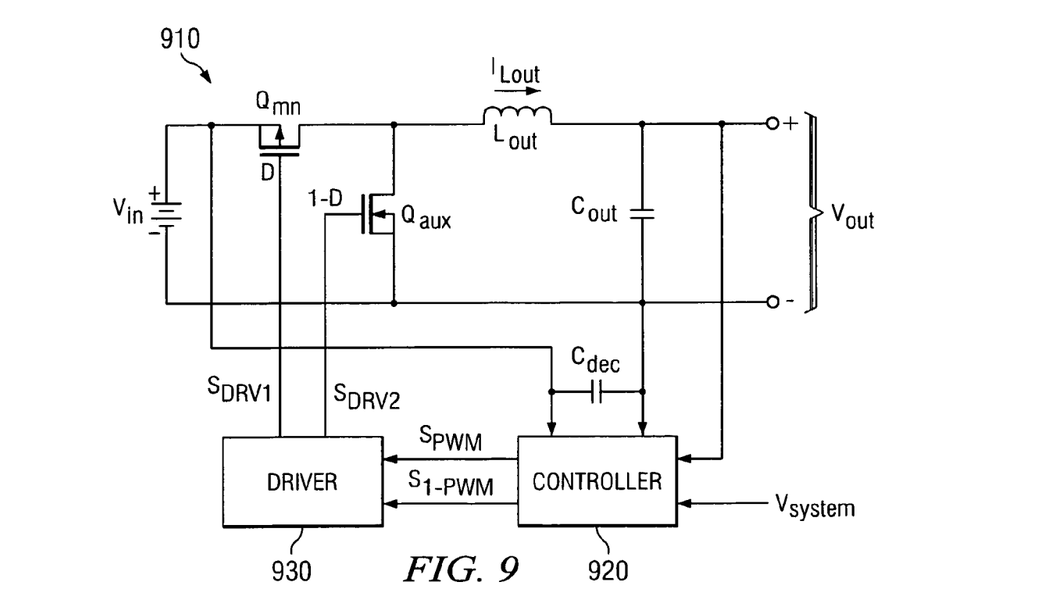
FIG. 9 illustrates a diagram of an embodiment of a power converter including power conversion circuitry constructed according to the principles of the present invention.

Turning now to FIG. 9, illustrated is a diagram of an embodiment of a power converter including power conversion circuitry constructed according to the principles of the present invention. The power converter includes a power train 910, a controller 920 and a driver 930, and provides power to a system such as a microprocessor. While in the illustrated embodiment, the power train 910 employs a buck converter topology, those skilled in the art should understand that other converter topologies such as a forward converter topology are well within the broad scope of the present invention.

The power train 910 receives an input voltage $V_{in}$ from a source of electrical power (represented by a battery) at an input thereof and provides a regulated output voltage $V_{out}$ to power, for instance, a microprocessor at an output thereof. In keeping with the principles of a buck converter topology, the output voltage $V_{out}$ is generally less than the input voltage $V_{in}$ such that a switching operation of the power converter can regulate the output voltage $V_{out}$. A switch (e.g., a main switch $Q_{mn}$) is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train 910. An AC component of the inductor current $I_{Lout}$ is filtered by the output capacitor $C_{out}$.

During a complementary interval (generally co-existent with a complementary duty cycle "1-D" of the main switch $Q_{mn}$), the main switch $Q_{mn}$ is transitioned to a non-conducting state and another switch (e.g., an auxiliary switch $Q_{aux}$) is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary switches $Q_{mn}$, $Q_{aux}$ may be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

The controller 920 receives a desired characteristic such as a desired system voltage $V_{system}$ from an internal or external source associated with the microprocessor, and the output voltage $V_{out}$ of the power converter. The controller 920 is also coupled to the input voltage $V_{in}$ of the power converter and a return lead of the source of electrical power (again, represented by a battery) to provide a ground connection therefor. While only a single ground connection is illustrated in the present embodiment, those skilled in the art should understand that multiple ground connections may be employed for use within the controller 120. A decoupling capacitor $C_{dec}$ is coupled to the path from the input voltage $V_{in}$ to the controller 120. The decoupling capacitor $C_{dec}$ is configured to absorb high frequency noise signals associated with the source of electrical power to protect the controller 920.

In accordance with the aforementioned characteristics, the controller 920 provides a signal (e.g., a pulse width modulated signal $S_{PWM}$) to control a duty cycle and a frequency of the main and auxiliary switches $Q_{mn}$, $Q_{aux}$ of the power train 910 to regulate the output voltage $V_{out}$ thereof. The controller 920 may also provide a complement of the signal (e.g., a complementary pulse width modulated signal $S_{1-PWM}$) in accordance with the aforementioned characteristics. Any controller adapted to control at least one switch of the power converter is well within the broad scope of the present invention. As an example, a controller employing digital circuitry is disclosed in U.S. Pat. No. 7,038,438 entitled "Controller for a Power Converter and a Method of Controlling a Switch Thereof," issued Mar. 28, 2006 to Dwarakanath, et al. and U.S. Pat. No. 7,019,505, entitled "Digital Controller for a Power Converter Employing Selectable Phases of a Clock Signal," issued Mar. 28, 2006 to Dwarakanath, et al., which are incorporated herein by reference.

The power converter also includes the driver 930 configured to provide drive signals $S_{DRV1}$, $S_{DRV2}$ to the main and auxiliary switches $Q_{mn}$, $Q_{aux}$, respectively, based on the signals $S_{PWM}$, $S_{1-PWM}$ provided by the controller 920. There are a number of viable alternatives to implement a driver 930 that include techniques to provide sufficient signal delays to prevent crosscurrents when controlling multiple switches in the power converter. The driver 930 typically includes switching circuitry incorporating a plurality of driver switches that cooperate to provide the drive signals $S_{DRV1}$, $S_{DRV2}$ to the main and auxiliary switches $Q_{mn}$, $Q_{aux}$. Of course, any driver 930 capable of providing the drive signals $S_{DRV1}$, $S_{DRV2}$ to control a switch is well within the broad scope of the present invention. As an example, a driver is disclosed in U.S. Pat. No. 7,330,017 entitled "Driver for a Power Converter and Method of Driving a Switch Thereof," issued Feb. 12, 2008 to Dwarakanath, et al., which is incorporated herein by reference. Also, an embodiment of a semiconductor device that may embody portions of the power conversion circuitry is disclosed in U.S. Pat. No. 7,230,302, entitled "Laterally Diffused Metal Oxide Semiconductor Device and Method of Forming the Same," issued Jun. 12, 2007 to Lotfi, et al., which is incorporated herein by reference, and an embodiment of an integrated circuit embodying power conversion circuitry, or portions thereof, is disclosed in U.S. Pat. No. 7,015,544, entitled "Integrated Circuit Employable with a Power Converter," issued Mar. 21. 2006 to Lotfi, et al., which is incorporated by reference.

Thus, an encapsulatable package for a magnetic device, a power module and a method of manufacture thereof with readily attainable and quantifiable advantages has been introduced. Those skilled in the art should understand that the previously described embodiments of the magnetic device and power module are submitted for illustrative purposes only. In addition, other embodiments capable of producing an encapsulatable package for a magnetic device and a power module while addressing the effects of magnetostriction and the like are well within the broad scope of the present invention. While the magnetic device has been described in the environment of a power converter, the magnetic device may also be incorporated into other systems or assemblies such as a communication or computing devices or other power processing devices.

As mentioned above, the present invention provides an encapsulatable package for a magnetic device with a magnetic core whose magnetic properties can be compromised by external mechanical stress. The magnetic core is surrounded by at least one conductive winding and is protected from stress induced by an encapsulant by a shielding structure that creates a chamber about at least a portion of the magnetic core. The shielding structure may be open at one end (such as at a junction between the magnetic core and an underlying substrate) such that the shielding structure can be readily positioned over the magnetic core. The shielding structure makes an incomplete, imperfect or partial seal about the magnetic core and preferably with an underlying surface against intrusion of an encapsulant. During encapsulation, a limited quantity of the encapsulant penetrates the seal, but does not make contact with sufficient surface area of the magnetic core to substantially compromise the magnetic performance thereof. In a further embodiment, the shielding structure includes a baffle to direct the penetrating encapsulant away from the magnetic core.

For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). For a better understanding of magnetic devices, see "Soft Ferrites: Properties and Applications," by E. C. Snelling, published by Butterworth-Heinemann, Second Edition, 1989. The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing an encapsulated package for a magnetic device on a substrate, comprising:
    providing a magnetic core on said substrate;
    placing a shielding structure including a baffle over said magnetic core to create a chamber thereabout;
    depositing an encapsulant about a portion of said magnetic core within said chamber, said shielding structure limiting said encapsulant entering said chamber and said baffle directing said encapsulant away from said magnetic core.

2. The method as recited in claim 1 further comprising allowing at least a portion of said encapsulant to exit said chamber via said shielding structure as said encapsulant cures.

3. The method as recited in claim 1 wherein said baffle is coupled to a sidewall of said shielding structure.

4. The method as recited in claim 1 wherein said shielding structure creates a partial seal about said magnetic core.

5. The method as recited in claim 1 wherein said shielding structure creates an opening between a junction of said shielding structure and said substrate.

6. The method as recited in claim 1 wherein said shielding structure is a protective cap.

7. The method as recited in claim 1 wherein said shielding structure is formed from a material selected from the group consisting of:
    a ceramic material,
    aluminum,
    copper, and
    molded plastic.

8. The method as recited in claim 1 further comprising locating a stand off on said substrate, said stand off being between said magnetic core and said substrate.

9. The method as recited in claim 1 further comprising providing electrical leads protruding from sidewalls of said substrate.

10. The method as recited in claim 1 further comprising placing at least one conductive winding about said magnetic core.

11. The method as recited in claim 1 further comprising placing at least one planar conductive winding about said magnetic core.

12. The method as recited in claim 1 wherein said shielding structure is configured to limit an exposure of said magnetic core to said encapsulant.

13. The method as recited in claim 1 wherein said magnetic core is formed from ferrite.

14. The method as recited in claim 1 wherein said substrate is a printed wiring board.

15. The method as recited in claim 1 wherein said encapsulant is an epoxy molding compound.

16. The method as recited in claim 1 further comprising providing electrical leads protruding from opposing sidewalls of said substrate to allow said magnetic device to be mounted to another substrate.

17. The method as recited in claim 1 further comprising providing electrical leads protruding from sidewalls of said substrate to accommodate through hole mounting or surface mounting of said magnetic device to another substrate.

18. The method as recited in claim 1 wherein said baffle is selected from the group consisting of:
    a plate,
    a wall, and
    a screen.

19. The method as recited in claim 1 wherein said baffle comprises one or more plates.

20. The method as recited in claim 1 wherein said baffle is coupled to said substrate.

* * * * *

UNITED STATES PATENT AND TRADEMARK OFFICE
CERTIFICATE OF CORRECTION

PATENT NO.        : 7,462,317 B2
APPLICATION NO. : 10/985825
DATED             : December 9, 2008
INVENTOR(S)       : Lotfi et al.

It is certified that error appears in the above-identified patent and that said Letters Patent is hereby corrected as shown below:

In Col. 1, line 41, after concern. insert new paragraph return.
In Col. 1, line 41, before protective insert --As those of ordinary skill in the art understand, it is highly desirable to provide a--.
In Col. 8, line 42, before Then insert new paragraph return.
In Col. 11, line 32, delete "Mar. 28" and insert --May 2--.
In Col. 11, line 63, delete "Mar. 21." and insert --Mar. 21,--.

Signed and Sealed this

Twenty-fourth Day of February, 2009

JOHN DOLL
*Acting Director of the United States Patent and Trademark Office*